(12) United States Patent
Wang et al.

(10) Patent No.: US 12,720,691 B2
(45) Date of Patent: Aug. 25, 2026

(54) AUTOMATIC UNLOCKING SYSTEM FOR IT CABINET

(71) Applicant: SCHNEIDER ELECTRIC IT CORPORATION, Foxboro, MA (US)

(72) Inventors: Le Wang, Shanghai (CN); Bo Liu, Shanghai (CN); MingJi Chen, Shanghai (CN); JinNan Shen, Shanghai (CN); Guanglin Zhu, Shanghai (CN)

(73) Assignee: SCHNEIDER ELECTRIC IT CORPORATION, Foxboro, MA (US)

( * ) Notice: Subject to any disclaimer, the term of this patent is extended or adjusted under 35 U.S.C. 154(b) by 466 days.

(21) Appl. No.: 18/211,367

(22) Filed: Jun. 19, 2023

(65) Prior Publication Data

US 2024/0008202 A1 Jan. 4, 2024

Related U.S. Application Data

(60) Provisional application No. 63/356,802, filed on Jun. 29, 2022.

(51) Int. Cl.
*H05K 5/02* (2006.01)

(52) U.S. Cl.
CPC ........... *H05K 5/0221* (2013.01); *H05K 5/023* (2013.01)

(58) Field of Classification Search
CPC ...... H05K 5/0221; H05K 5/023; E05B 47/00; E05B 13/106; E05B 17/0037; E05B 65/02; E05B 2047/0086; E05B 2063/0091
USPC ...................................................... 292/336.3
See application file for complete search history.

(56) References Cited

U.S. PATENT DOCUMENTS 1,635,028 A * 7/1927 Burr ...................... E05B 47/026 292/DIG. 3
4,026,588 A * 5/1977 Bisbing ................. E05C 19/165 292/251.5
4,800,741 A * 1/1989 Kerschenbaum ... E05B 47/0002 70/279.1
7,681,424 B2 * 3/2010 Antonucci .......... E05B 47/0657 70/279.1
9,743,549 B2 * 8/2017 Jiang .................... H05K 7/1492
11,314,293 B1 * 4/2022 Varrey .................... G06F 1/187
2007/0277571 A1 12/2007 Gokcebay (Continued)

FOREIGN PATENT DOCUMENTS

CN 108798284 A 11/2018
EP 3165694 B1 2/2019

(Continued)

OTHER PUBLICATIONS

Extended European Search Report from corresponding European Application No. 23182177.8 dated Oct. 26, 2023.

*Primary Examiner* — Nathan Cumar
(74) *Attorney, Agent, or Firm* — FIG. 1 Patents

(57) ABSTRACT

An automatic unlocking system for an IT equipment rack includes a handle assembly mounted on a door of the IT equipment rack. The handle assembly includes a handle and a cam coupled to the handle. The system further includes an unlock assembly mounted on a wall of the IT equipment rack. The unlock assembly includes a unlock mechanism having at least one rod. The unlock mechanism is configured to open the door when the cam rotates causing the movement of the at least one rod, and open the door when the unlock assembly receives an electrical unlock signal.

32 Claims, 9 Drawing Sheets

(56) References Cited

U.S. PATENT DOCUMENTS

| | | | | |
|---|---|---|---|---|
| 2022/0120117 | A1* | 4/2022 | Ottino | B60J 5/0479 |
| 2022/0159861 | A1* | 5/2022 | Crisp | E05C 19/163 |
| 2022/0167520 | A1* | 5/2022 | Wu | H05K 7/1489 |
| 2022/0174837 | A1* | 6/2022 | Antaran | H05K 7/1492 |
| 2022/0183340 | A1* | 6/2022 | Tieman | A47J 37/129 |
| 2022/0187847 | A1* | 6/2022 | Cella | G05B 19/41885 |
| 2022/0194661 | A1* | 6/2022 | Wang | B65D 25/2802 |
| 2023/0069462 | A1* | 3/2023 | Arens | E05B 47/0012 |

FOREIGN PATENT DOCUMENTS

| | | | |
|---|---|---|---|
| EP | 4299862 | A1 | 1/2024 |
| KR | 100851453 | B1 | 8/2008 |
| KR | 100972114 | B1 | 7/2010 |

* cited by examiner

Mechanical flow
Electrical flow
Signal flow
Thermal flow 100
102

130

120

22
26
28

110

AUTOMATIC UNLOCKING SYSTEM FOR IT CABINET

CROSS-REFERENCE TO RELATED APPLICATION

This application claims the benefit under 35 U.S.C. § 119(e) of U.S. Provisional Patent Application No. 63/356,802 titled AUTOMATIC UNLOCKING SYSTEM FOR IT CABINET filed on Jun. 29, 2022, which is incorporated herein by reference in its entirety for all purposes.

BACKGROUND OF THE DISCLOSURE

1. Field of Disclosure

The present disclosure is generally directed to enclosures or equipment racks used to support IT equipment, and more particularly to an automatic unlocking system provided for such equipment racks.

2. Discussion of Related Art

IT equipment racks, which are sometimes referred to as IT racks or IT cabinets, can be configured with locks to protect and safeguard electronic equipment contained in such equipment racks. Current locking systems for IT equipment racks cannot unlock and open a door 1) by using an electrical signal only, and 2) by using a handle only. For example, prior locking systems that electrically unlock and open the door cannot be unlocked and opened using a key and handle instead. This makes it difficult if not impossible to open the rack if the electronic system fails, for example during a power outage. In another example, prior systems that can be unlocked and opened using a key and handle cannot be unlocked and opened electrically instead. This does not permit opening the rack door remotely and/or automatically in case of emergency, e.g., overheating.

SUMMARY OF THE DISCLOSURE

Embodiments of the automatic unlocking system of the present disclosure are configured to cooperate with an unattended data center to realize remote openings of doors of IT cabinets, or to enable a cabinet door to be opened quickly and automatically to meet set conditions, as well as local manual and mechanical opening. The system can be compatible with an existing electronic lock to realize multiple opening modes, such as mechanical key unlocking, card swiping unlocking, fingerprint unlocking, face recognition unlocking and so on. Compared with other existing schemes, the system has the advantages of high safety, high reliability, low-cost and simple installation.

The automatic unlocking system can solve the problem that the current IT cabinet in the data center cannot be unlocked when the software/hardware of the electronic access control system in an unexpected system error occurred. For example, for a door having an electronic door lock and a magnetic lock in the cabinet door lock configuration, when the magnetic lock cannot be powered off, such an occurrence will not only invalidate the electronic unlocking, but also invalidate the mechanical unlocking. The system can use the key for mechanical unlocking in emergency, which is not affected by any electronic and electrical faults.

The automatic unlocking system can be reliably applied to unattended scenes. The working logic of a self-popping (self-opening) emergency system is, when the control system detects that the temperature inside the cabinet is higher than the safety threshold, and the air conditioner is partially and/or completely invalid, the system will address an overheating problem in the IT cabinet while giving an alarm. Further, the system will automatically open the cabinet door to make the cold air in the external room enter the IT cabinet, so that the internal equipment can work continuously for a certain period of time. In case of fire in the equipment in the cabinet, the system cooperates with the fire action of the fire-fighting equipment. In this circumstance, the cabinet has a built-in fire-fighting module. The system locks the cabinet door and starts the fire-fighting module at the same time. When the external fire-fighting system is employed, the cabinet door opens automatically and the remote alarm is triggered.

For higher safety requirements, the automatic unlocking system can be loaded with an electromechanical interlocking function, such that when the system is in a normal mode of operation, a mechanical key cannot be used to unlock the cabinet door. The mechanical key only can be used in an electrical control system fault status. With this mode of operation, because of the high reliability of mechanical unlocking, for safety reasons, the mechanical unlocking mode has the highest level of authority to meet the door opening demand in an emergency, but it still has the electronic authority higher than the authorization in the non-emergency state. However, since the mechanical key itself is difficult to be controlled remotely, the electronic system cannot automatically record the person who opens the door with the mechanical key, and the key is easy to be stolen and copied, which has potential safety hazards. The system with the electromechanical interlocking function can avoid this safety hazards.

One aspect of the present disclosure is directed to an automatic unlocking system for an IT equipment rack. In one embodiment, the system comprises a handle assembly mounted on a door of the IT equipment rack. The handle assembly includes a handle and a cam coupled to the handle. The system further comprises an unlock assembly mounted on a wall of the IT equipment rack. The unlock assembly includes a unlock mechanism having at least one rod. The unlock mechanism is configured to open the door when the cam engages the at least one rod, and open the door when the lock receives an electrical unlock signal.

Embodiments of the automatic unlocking system further may include a controller coupled to the unlock mechanism of the unlock assembly to control the operation of the unlock mechanism. The automatic unlocking system further may include a sensor positioned within the IT equipment rack and coupled to the controller. The sensor may be configured to detect a parameter, such as heat, within the IT equipment rack. The handle assembly further may include a base secured to the door and configured to support the handle. The handle assembly further may include a lock supported by the base and configured to secure and release the handle. The handle may be configured to rotate the cam to open the door. The unlock assembly further may include a housing configured to support the unlock mechanism. The unlock assembly further may include a latch configured to releasably engage and secure a hook associated with the door to secure the door in a closed position. The unlock assembly further may include a spring pin subassembly coupled to the cam and the rod. The spring pin subassembly may be configured to translate rotation of the cam to engage the rod. The spring pin subassembly may include a first spring pin configured to engage the cam and a second spring pin configured to engage the rod. The second spring pin may be perpendicular to the first spring pin, the first spring pin and the second spring pin each having mating chamfered surfaces.

Another aspect of the present disclosure is directed to a door opening system comprising a handle, a cam coupled to the handle and configured to engage at least one rod when the handle is rotated, and a lock configured to open a door when the cam engages the at least one rod, and open the door when the lock receives an electrical unlock signal.

Another aspect of the present disclosure is directed to an automatic unlocking system for an IT equipment rack. In one embodiment, the system comprises a handle assembly mounted on a door of the IT equipment rack. The handle assembly includes a handle and a cam coupled to the handle. The system further comprises an unlock assembly mounted on a wall of the IT equipment rack. The unlock assembly includes a unlock mechanism having at least one rod. The unlock mechanism is configured to open the door when the cam rotates causing the movement of the at least one rod, and open the door when the unlock assembly receives an electrical unlock signal.

Embodiments of the automatic unlocking system further may include a controller coupled to the unlock mechanism of the unlock assembly to control the operation of the unlock mechanism. The automatic unlocking system further may include a sensor positioned within the IT equipment rack and coupled to the controller. The sensor may be configured to detect a parameter within the IT equipment rack, the controller being configured to send the electrical unlock signal when the parameter exceeds a predetermined threshold. The handle assembly further may include a base secured to the door and configured to support the handle. The handle assembly further may include a lock supported by the base and configured to secure and release the handle. The handle may be configured to rotate the cam to open the door. The automatic unlocking system further may include a housing configured to support the unlock mechanism. The unlock assembly further may include a latch configured to releasably engage and secure a hook associated with the door to secure the door in a closed position. The at least one rod may be configured to move a latch of the unlock assembly from a first position in which the latch engages and secures a hook of the door to maintain the door in a locked condition to a second position in which the latch disengages the hook of the door when the cam rotates to cause the movement of the at least one rod to unlock the door. The electrical unlock signal may be configured to move the latch from the first position to the second position to open the door when the unlock assembly receives an electrical unlock signal. The unlock assembly further may include a spring pin subassembly coupled to the cam and the at least one rod. The spring pin subassembly may be configured to translate rotation of the cam to engage the at least one rod. The spring pin subassembly may include a first spring pin configured to engage the cam and a second spring pin configured to engage the at least one rod. The second spring pin may be perpendicular to the first spring pin, with the first spring pin and the second spring pin each having mating chamfered surfaces. The unlock assembly further may include an actuator including a plunger configured to engage and move the door when the cam moves the at least one rod and engage and move the door when the lock receives an electrical unlock signal. The actuator further may include a spring to move the plunger outward toward the door.

Yet another aspect of the present disclosure is directed to a door opening system comprises a handle, a cam coupled to the handle and configured to move at least one rod when rotated by the handle, and an unlock assembly including the at least one rod. The unlock assembly is configured to open a door when the cam moves the at least one rod, and open the door when the lock receives an electrical unlock signal.

Embodiments of the door opening system further may include a controller coupled to the unlock assembly to control the operation of the lock. The door opening system further may include a sensor positioned within an IT equipment rack and coupled to the controller. The sensor may be configured to detect a parameter within the IT equipment rack. The handle may include a base secured to the door and configured to support the handle. The base of the handle may be configured to support the lock, the lock being configured to secure and release the handle. The system handle may be configured to rotate the cam to open the door. The at least one rod may be configured to unlock a latch, which is configured to releasably engage and secure a hook associated with the door to secure the door in a closed position. The electrical unlock signal may be configured to unlock a latch, which is configured to releasably engage and secure a hook associated with the door in the closed position. The unlock assembly further may include an actuator including plunger configured to engage and move the door when the cam moves the at least one rod and engage and move the door when the lock receives an electrical unlock signal. The actuator further may include a spring to move the plunger outward toward the door.

Another aspect of the present disclosure is directed to a method of opening a door of an IT equipment rack by one of two modes. In one embodiment, the method comprises: opening the door by a first mode including rotating a handle and a cam coupled to the handle, the cam being configured to move at least one rod of a unlock mechanism when rotated to unlock a latch of the lock mechanism; or opening the door by a second mode including sending an electrical unlock signal to the unlock mechanism to unlock a latch of the unlock mechanism.

Embodiments of the method further may include sensing a parameter within the IT rack, and opening the door by the second mode when the parameter exceeds a predetermined threshold. The latch may be configured to releasably engage and secure a hook associated with the door to secure the door in a closed position. The cam may be configured to move the at least one rod by engaging a first spring pin of a spring pin subassembly. The first spring pin may be configured to engage a second spring pin, which is configured to engage the at least one rod. The second spring pin may be perpendicular to the first spring pin, the first spring pin and the second spring pin each having mating chamfered surfaces.

Another aspect of the present disclosure is directed to an automatic unlocking system to open a door of an IT equipment rack. In one embodiment, the system comprises means for opening the door by a first mode including rotating a handle to unlock a latch, and means for opening the door by a second mode including sending an electrical unlock signal to unlock the latch. The means for opening the door by the first mode includes a cam coupled to the handle, the cam being configured to move at least one rod when rotated to unlock the latch.

BRIEF DESCRIPTION OF DRAWINGS

Various aspects of at least one example are discussed below with reference to the accompanying figures, which are not intended to be drawn to scale. The figures are included to provide illustration and a further understanding of the various aspects and examples, and are incorporated in and constitute a part of this specification, but are not intended as a definition of the limits of the disclosure. In the figures, identical or nearly identical components illustrated in various figures may be represented by like numerals. For purposes of clarity, not every component may be labeled in every figure. In the drawings.

DETAILED DESCRIPTION

This disclosure is not limited in its application to the details of construction and the arrangement of components set forth in the following descriptions or illustrated by the drawings. The disclosure is capable of other embodiments and of being practiced or of being carried out in various ways. Also, the phraseology and terminology used herein is for description purposes and should not be regarded as limiting. The use of "including," "comprising," "having," "containing," "involving," and variations herein, are meant to be open-ended, i.e., "including but not limited to."

Embodiments of an automatic unlocking system of the present disclosure employs a special-shaped cam structure that is used on a trigger structure of a lock. The mechanical universality of the system is better than prior art unlocking systems, and can be compatible with all IT cabinet doors designed according to industry standards, with existing mechanical locks of an IT cabinet able to be replaced. The tolerance is improved, and the installation error of +/−8 millimeters (mm) can be tolerated. The mechanical electronic unlocking of ordinary structure can only meet an installation error of +/−3 mm maximum.

The automatic unlocking system parallels the electronic trigger unlocking and mechanical trigger unlocking through mechanical mode, and separates the locking mechanism from the unlocking trigger mechanism, so that the system can realize a variety of door opening modes, so that the automatic door opening in emergency and the authorized door opening mode in normal state can exist at the same time, providing a new safe and reliable door opening scheme for remote management and on-site unattended. Most systems on the market cannot open the emergency door automatically, authorize the normal state and open the door remotely at the same time, while the automatic unlocking system can perfectly realize the three methods at the same time.

Figure 1:
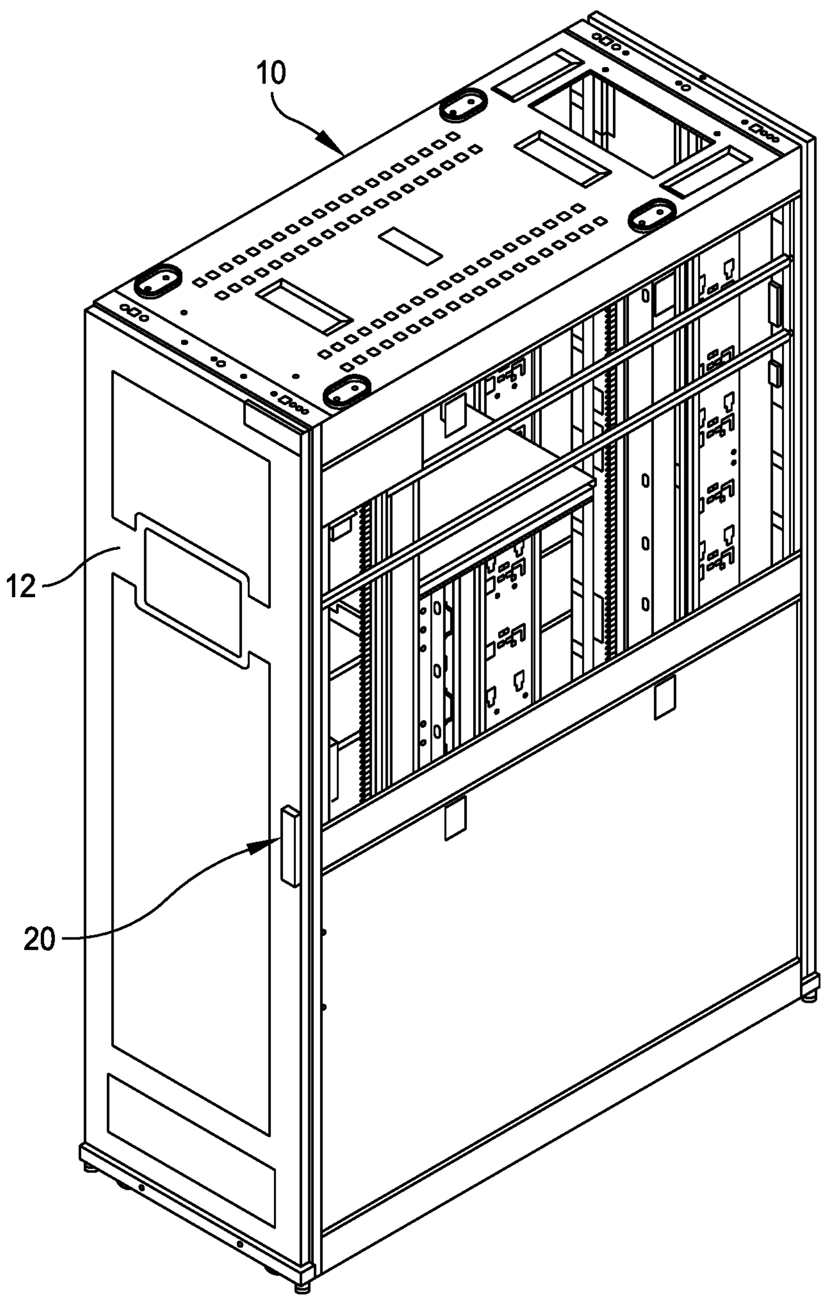
FIG. 1 is a perspective view of an IT equipment rack having an automatic unlocking system of an embodiment of the present disclosure.

Referring to the drawings, and more particularly to FIG. 1, an IT equipment rack, sometimes referred to as an IT rack or an IT cabinet, is generally indicated at 10. As shown, the IT equipment rack 10 is an enclosed structure including a top wall, a bottom wall, opposite side walls, a front and a back. In some embodiments, the front (and the back) of the IT equipment rack includes a door 12, which is hingedly attached to the side wall of the IT equipment rack to swing between an open position and a closed position (shown in FIG. 1). In one embodiment, the door 12 can be attached to the frame of the equipment rack by optional spring hinges, which provide torque to open the door when the door is unlocked. To maintain the IT equipment rack 10 in the closed and a secure condition, the IT equipment rack includes an automatic unlocking system, generally indicated at 20, provided on the door 12 and the side wall of the IT equipment rack. As will be described in greater detail below, the automatic unlocking system 20 is configured to unlock the door during the occurrence of two events. The first event is when a person unlocks a lock associated with a door handle of the door to release a latch. The second event is when a person unlocks the door electronically to release the latch.

Figure 2:
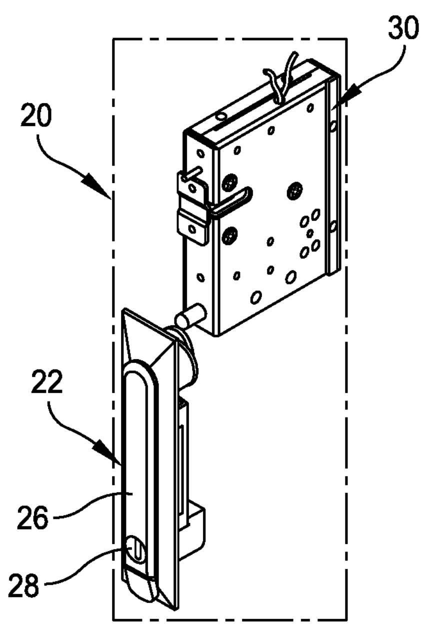
FIG. 2 is a perspective view of the automatic unlocking system.

Referring to FIGS. 2-6, the automatic unlocking system 20 includes a handle assembly, generally indicated at 22, which is mounted on the door 12 of the IT equipment rack 10. In one embodiment, the handle assembly 22 includes a base 24 mounted on the door 12, a handle 26 that is movable to open the door 12, and a lock 28, which is shown to be a cylindrical lock. The automatic unlocking system 20 further includes an unlock assembly, generally indicated at 30, which is mounted on the side wall of the IT equipment rack 10, for example. The unlock assembly 30 includes a housing 32 mounted on the side wall of the IT equipment rack 10. The unlock assembly 30 is configured to releasably secure a hook 34, which is shown in FIG. 2 as being disassociated from the door 12 of the IT equipment rack 10.

Figure 3:
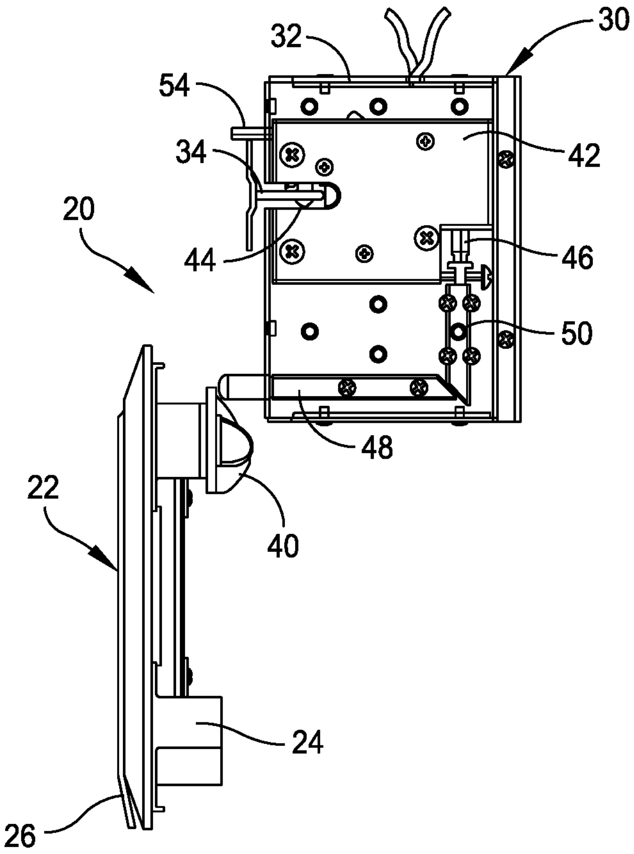
FIG. 3 is an elevational view of the automatic unlocking system shown in a locked state of operation.
Figure 4:
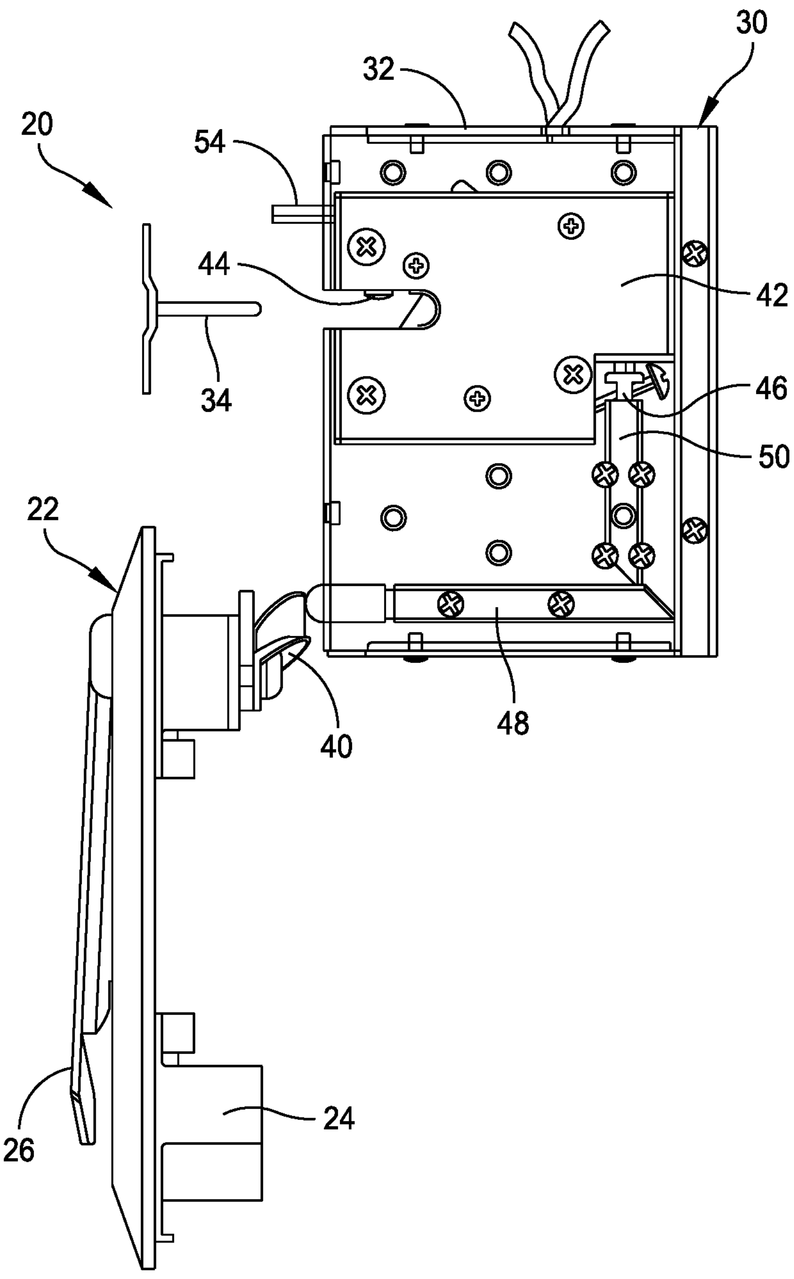
FIG. 4 is an elevational view of the automatic unlocking system shown in an unlocked state of operation.

Referring specifically to FIGS. 3 and 4, the handle assembly 22 further includes a rotatable, special-shaped cam 40 that is coupled to the handle 26 so that the cam rotates when rotating the handle 26. The arrangement is such that the handle 26 as shown in FIG. 3 is in a stowed away position in which the cylindrical lock 28 can be locked to lock the door 12 in the closed or shut position. When the cylindrical lock 28 is unlocked, the handle 26 can be lifted from the stowed position (FIG. 4) and rotated with respect to the base 24 to achieve the rotation of the cam 40. The rotational movement of the handle 26 causes the rotation of the cam 40. As will be discussed in greater detail below, the cam 40 includes a cam surface that is configured to engage a structure of the unlock assembly 30 that functions as a cam follower.

The unlock assembly 30 further includes a unlock mechanism 42 having a latch 44 that is configured to releasably secure the hook 34 associated with the door 12. A description of the unlock mechanism 42 will be described in greater detail below. The latch 44 is shown in a engaged position in FIG. 3 in which the latch secures the hook 34 of the door 12 to maintain the door in a closed, locked position. The latch 44 is shown in a disengaged position in FIG. 4 in which the latch is disengaged from the hook 34 of the door 12 to release the door thereby enabling a person to open the door.

The unlock mechanism 42 further includes a rod 46 that is coupled to the latch 44 to move the latch between the engaged and disengaged positions with respect to the hook 34. FIG. 3 illustrates the rod 46 in a biased, downwardly extending position. The unlock assembly 30 further includes spring pin subassembly having a first spring pin 48 and a second spring pin 50.

The first spring pin 48 has a first end with an outer rounded surface that is disposed adjacent to the cam 40 and is positioned to be engaged by the cam to move laterally (horizontally as shown in FIGS. 3 and 4). The first end of the first spring pin 48 functions as a cam follower when engaged by the cam surface of the cam. Specifically, cam surface causes the lateral movement of the first spring pin 48 when the cam 40 is rotated by the door handle 26. The first spring pin 48 further has a second end with a chamfered surface that is disposed adjacent the second spring pin 50. The second spring pin 50 has a first end with a mating chamfered surface and a second end with a flat surface that engages the rod. As mentioned above, the rod 46 of the unlock mechanism 42 is configured to bias the second spring pin 50 downwardly, which in turn biases the first spring pin 48 laterally outwardly from the housing 32 of the unlock assembly 30.

The arrangement is such that when in the locked condition (FIG. 3), the first spring pin 48 maintains its laterally outwardly biased condition and the latch 44 is shown to be secured to the hook 34 of the door 12. When in the unlocked condition (FIG. 4), the handle 26 is rotated to rotate the cam 40. This motion causes the cam 40 to engage the first spring pin 48 of the spring pin subassembly to laterally move the first spring pin toward the second spring pin 50. This motion causes the second spring pin 50 to move upwardly to move the rod 46 against its downward bias to trigger the unlock mechanism 42 to unlock the latch 44 from the hook 34. The hook 34 is shown being disassociated from the latch 44 of the unlock assembly 30 to enable the door 12 to "pop" open in the manner described below.

Figure 5:
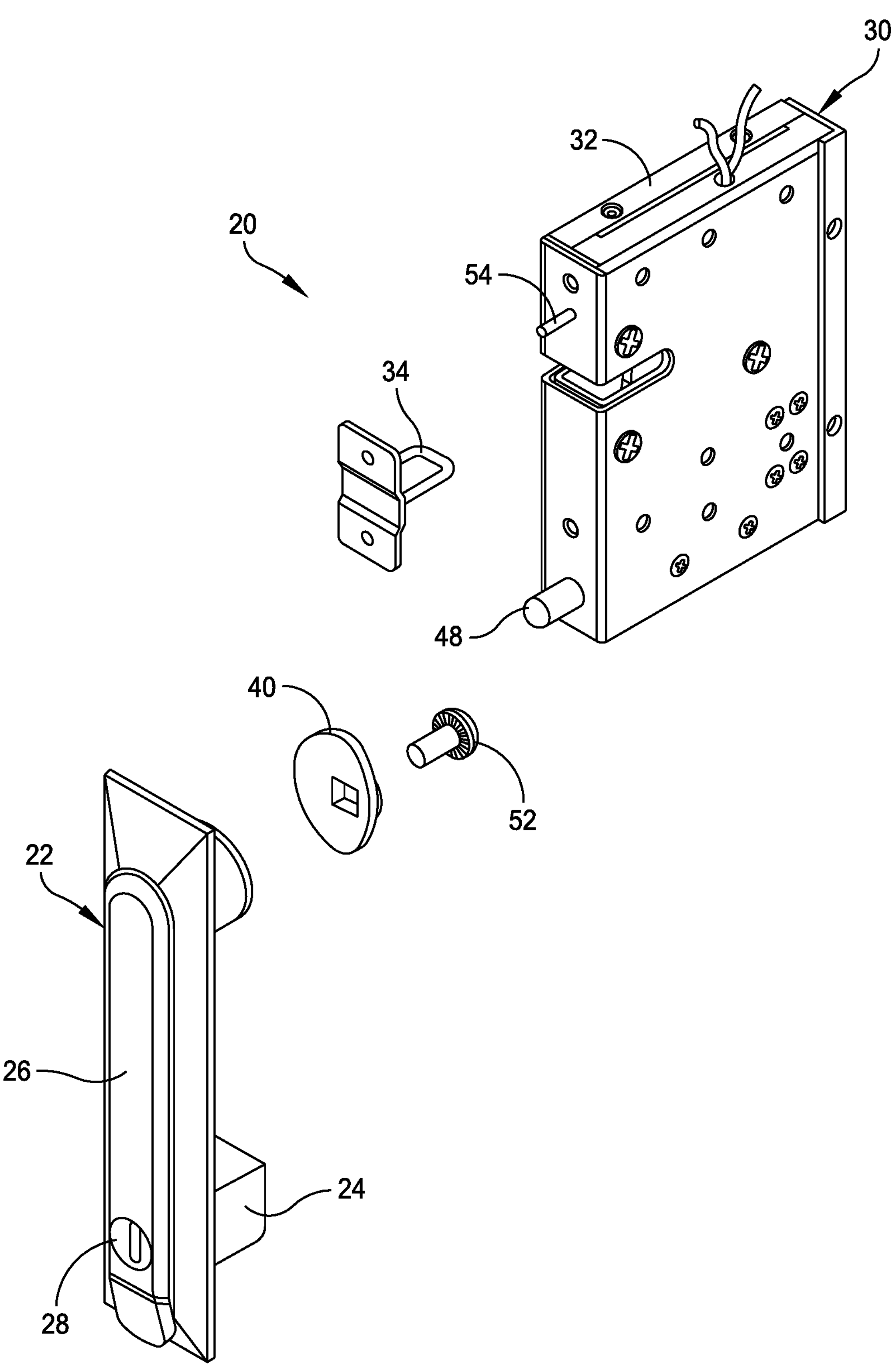
FIG. 5 is an exploded perspective view of the automatic unlocking system.
Figure 6:
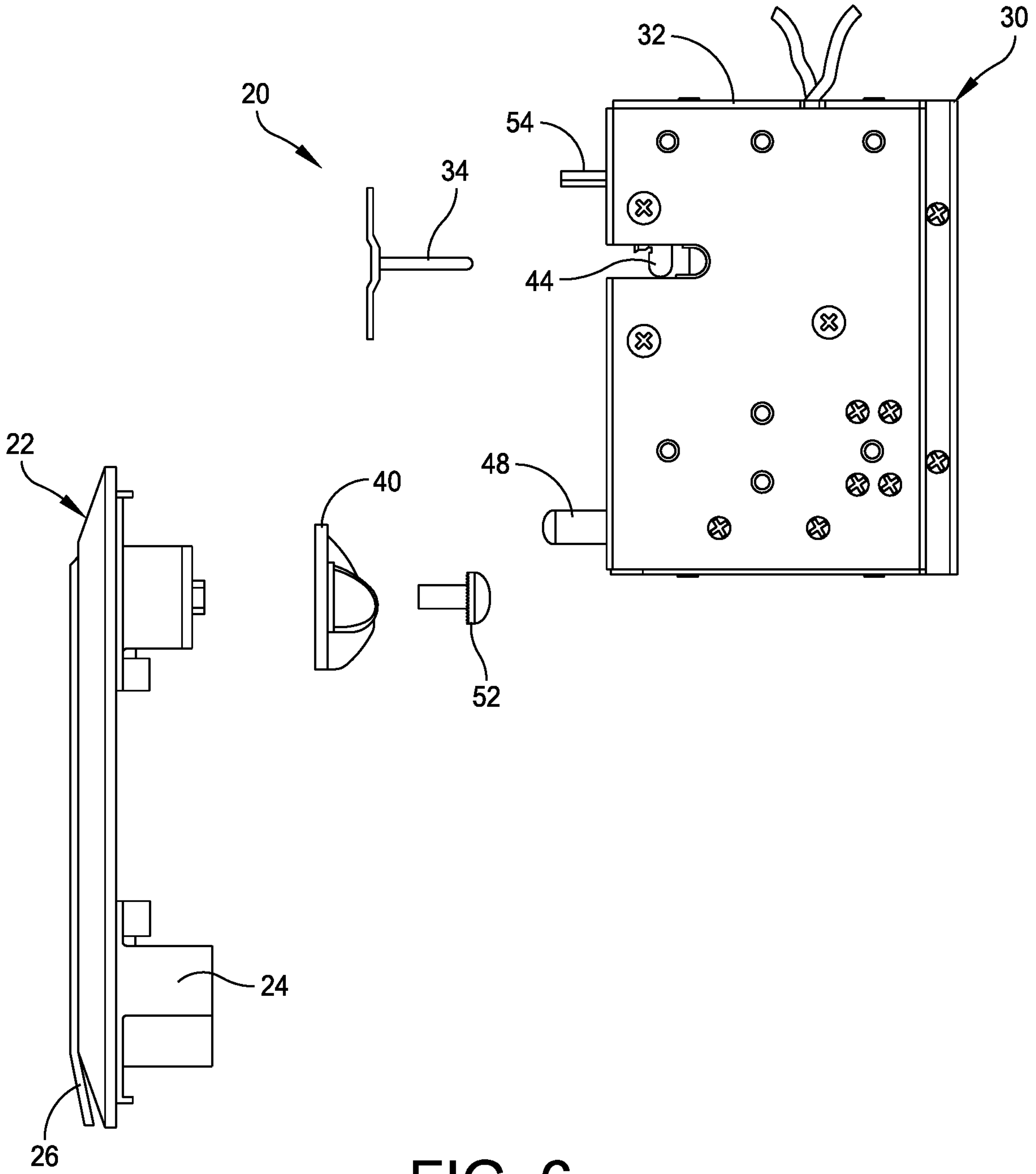
FIG. 6 is an exploded elevational view of the automatic unlocking system.

FIGS. 5 and 6 illustrate the component parts of the automatic unlocking system 20. As shown, the handle assembly 22 includes the cam 40 that is secured to the base by a threaded fastener, e.g., a bolt 52. The hook 34 is shown disassociated from the door 12 of the IT equipment rack 10 as well.

In one embodiment, the unlock mechanism 42 of the unlock assembly 30 may embody the mechanism disclosed in U.S. application Ser. No. 17/808,911, filed on Jun. 24, 2022, and titled ELECTRIC LOCK AND CONTROL METHOD THEREOF, which is incorporated herein by reference in its entirety for all purposes. The unlock mechanism 42 of the unlock assembly 30 is configured to operate mechanically and electronically to unlock the latch 44 from the hook 34.

The unlock mechanism 42 may include positive-input terminal, negative-input terminal, and supply-output terminal. In some embodiments, the unlock mechanism 42 may include negative-output terminal, which may be coupled to a negative-electromagnet terminal. The unlock mechanism 42 may include a common terminal, which may be a combination of first NC-input terminal and first NO-input terminal on a microswitch. In an unlocked state, when power is transmitted from a power supply to an electromagnet, a voltage may be applied across the electromagnet. When a voltage is established across the electromagnet, the electromagnet may cause a force to be applied onto a microswitch lever of the microswitch such that an NC switch opens and an NO switch. For example, the electromagnet may include a rod, e.g., rod 46, that is initially held in an outward, extended position from electromagnet by a first spring. When a voltage is established across the electromagnet, a magnetic force may cause the rod 46 to move inward (retracted) to the electromagnet. The rod 46 may be mechanically coupled to a first hook lever of a first hook. When the rod 46 moves inward to the electromagnet, the rod 46 may apply a force onto the first hook lever such that the first hook rotates about a pivot. During this rotation, a second hook lever of the first hook may apply of force onto the microswitch lever. When a voltage is established across the electromagnet, the electromagnet may cause a force to be applied onto the latch 44 of second hook such that the latch 44 clears the hook 34 of the door. When the latch 44 clears the hook 34, the door may be opened. In this regard, the lock may be unlocked when the latch 44 clears hook 34. When a voltage is established across the electromagnet, a magnetic force may cause the rod 46 to move inward to the electromagnet. When the rod 46 moves inward to the electromagnet, the rod 46 may apply a force onto the first hook lever such that the first hook rotates about pivot. Before the first hook rotates about the pivot, the second hook may be held in a first position where the latch 44 engages or otherwise occupies the hook 34. In this regard, the lock may be locked when the latch 44 occupies the hook 34. The second hook may be held in the first position by an angled portion of the first hook such that a surface of the angled portion presses against the surface of the second hook under tension from a second spring. When the rod 46 moves inward to the electromagnet, the angled portion may rotate about the pivot. When the angled portion rotates about the pivot, the second spring may apply a force onto the second hook such that the latch 44 rotates about the pivot. When the latch 44 rotates about the pivot, the latch 44 may clear the hook 34. Accordingly, the electromagnet is configured to open the latch 44 in response to a voltage being applied across the electromagnet by applying a force onto at least one of the first hook or the second hook.

In some embodiments, a pushing surface of the second hook may apply a force on the hook 34 when the second hook rotates about the pivot. In this manner, the second hook of the unlock assembly 30 may push door open when lock is unlocked.

In the shown embodiment, instead or in addition to the pushing surface of the second hook, the unlock mechanism 42 of the unlock assembly 30 includes an actuator to apply a force on the door such that unlock mechanism pushes the door open when the unlock assembly 30 lock is unlocked. In one embodiment, the actuator includes a plunger 54 that is pushed outward toward the door. In a certain embodiment, the actuator further includes a spring to move the plunger 54 outward toward the door. With this embodiment, the actuator may be referred to as a spring-loaded actuator. The door may press on the plunger 54 and compress the spring when held in a closed position by the latch 44. When the latch 44 clears the hook 34, the spring applies a force onto the plunger 54, which may in turn pushes the door open. In other embodiments, a suitable device, e.g., a solenoid or a motor, may be provided to move the plunger.

Figure 7:
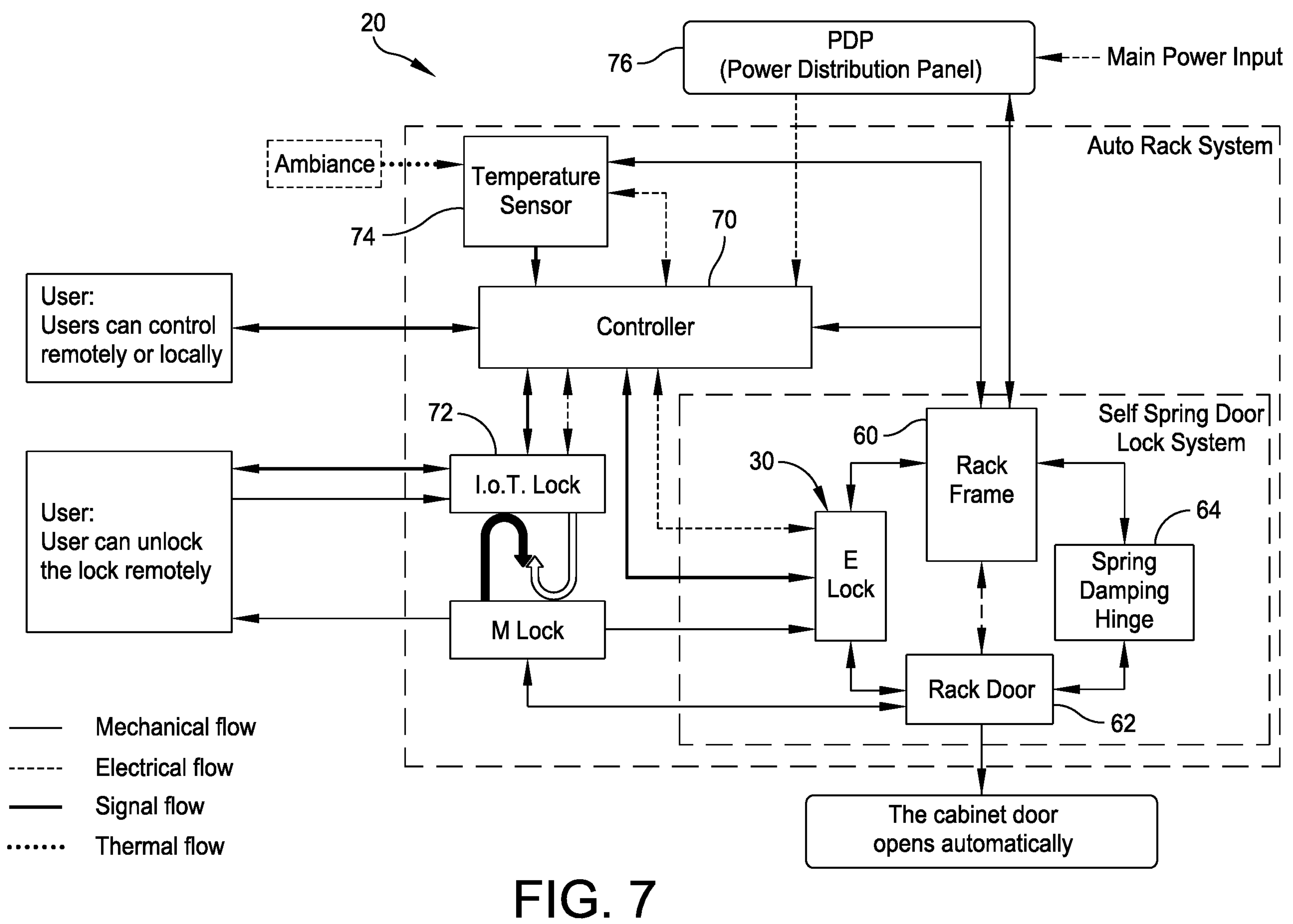
FIG. 7 is a schematic diagram of the automatic unlocking system for one IT equipment rack.

FIG. 7 illustrates a schematic diagram of the operation of the automatic unlocking system 20. As shown, the mechanical components of the automatic unlocking system 20 include a rack frame 60, rack door 62 coupled to the rack frame by a spring damping hinge 64, and the unlocking assembly 30 of the automatic unlocking system coupled to the rack frame and the rack door. The electronic components of the automatic unlocking system 20 include a controller 70 coupled to the rack frame 60 and the unlocking assembly 30 of the automatic unlocking system 20 and one of a mechanical lock, such as the handle assembly 22 and an Internet of Things (IoT) lock 72, which can be locked and unlocked by a number of known methods. The electronic components of the automatic unlocking system 20 further may include a temperature sensor 74, which in one embodiment is provided in the rack frame 60 and coupled to the controller 70. A power input 76 is provided to provided power to the rack frame 60 and the controller 70.

The operation of the automatic unlocking system is as follows:

Mechanical Unlock

In one embodiment, the automatic unlocking system employs an ordinary mechanical handle lock and has the following unlocking action steps. First, a user releases or unlocks the mechanical lock handle with the mechanical key. Second, the user turns or rotates the mechanical lock handle. Third, the rotation of the handle rotates the special-shaped cam. Fourth, the cam drives the movement of the spring pin subassembly by compressing the first spring pin. Fifth, the second spring pin of the spring pin subassembly moves the rod of the unlock mechanism to activate the unlock mechanism. Sixth, the latch of the unlock mechanism disengages the hook of the door of the IT equipment rack. And seventh, the door of the IT equipment rack opens automatically.

In another embodiment, the automatic unlocking system uses an IoT lock and has the following unlocking action steps. First, the user releases or unlocks the mechanical lock handle with one of a swipe card reader, a fingerprint scanner, a password keypad, a face recognition system, or a key. Second, the user turns or rotates the mechanical lock handle. Third, the rotation of the handle rotates the special-shaped cam. Fourth, the cam drives the movement of the spring pin subassembly by compressing the first spring pin. Fifth, the second spring pin of the spring pin subassembly moves the rod of the unlock mechanism to activate the unlock mechanism. Sixth, the latch of the unlock mechanism disengages the hook of the door of the IT equipment rack. And seventh, the door of the IT equipment rack opens automatically.

Electronic Unlock

In one embodiment, a system administrator uses a local control panel to unlock the automatic unlocking system and employs the following unlocking action steps. First, an administrator using the local control panel sends unlocking signal to the controller of the automatic unlocking system. Second, the controller sends out an unlocking signal to the unlock mechanism. Third, an electronic signal excites a lock of the unlock mechanism. Fourth, the unlock mechanism moves the latch to release the latch from the hook. And fifth, the door of the IT equipment rack opens automatically.

In another embodiment, for an emergency unlock, the automatic unlocking system employs the following unlocking action steps. First, the automatic unlocking system detects an emergency and sends a message to the controller. Second the controller sends out an unlocking signal to the unlock mechanism. Third, an electronic signal excites a lock of the unlock mechanism. Fourth, the unlock mechanism moves the latch to release the latch from the hook. And fifth, the door of the IT equipment rack opens automatically.

In another embodiment, for remote electronic unlocking, the automatic unlocking system employs the following unlocking action steps. First, the administrator sends a remote unlocking command to the controller. Second, the controller sends out unlocking signal to the unlock mechanism. Third, an electronic signal excites a lock of the unlock mechanism. Fourth, the unlock mechanism moves the latch to release the latch from the hook. And fifth, the door of the IT equipment rack opens automatically.

Figure 8:
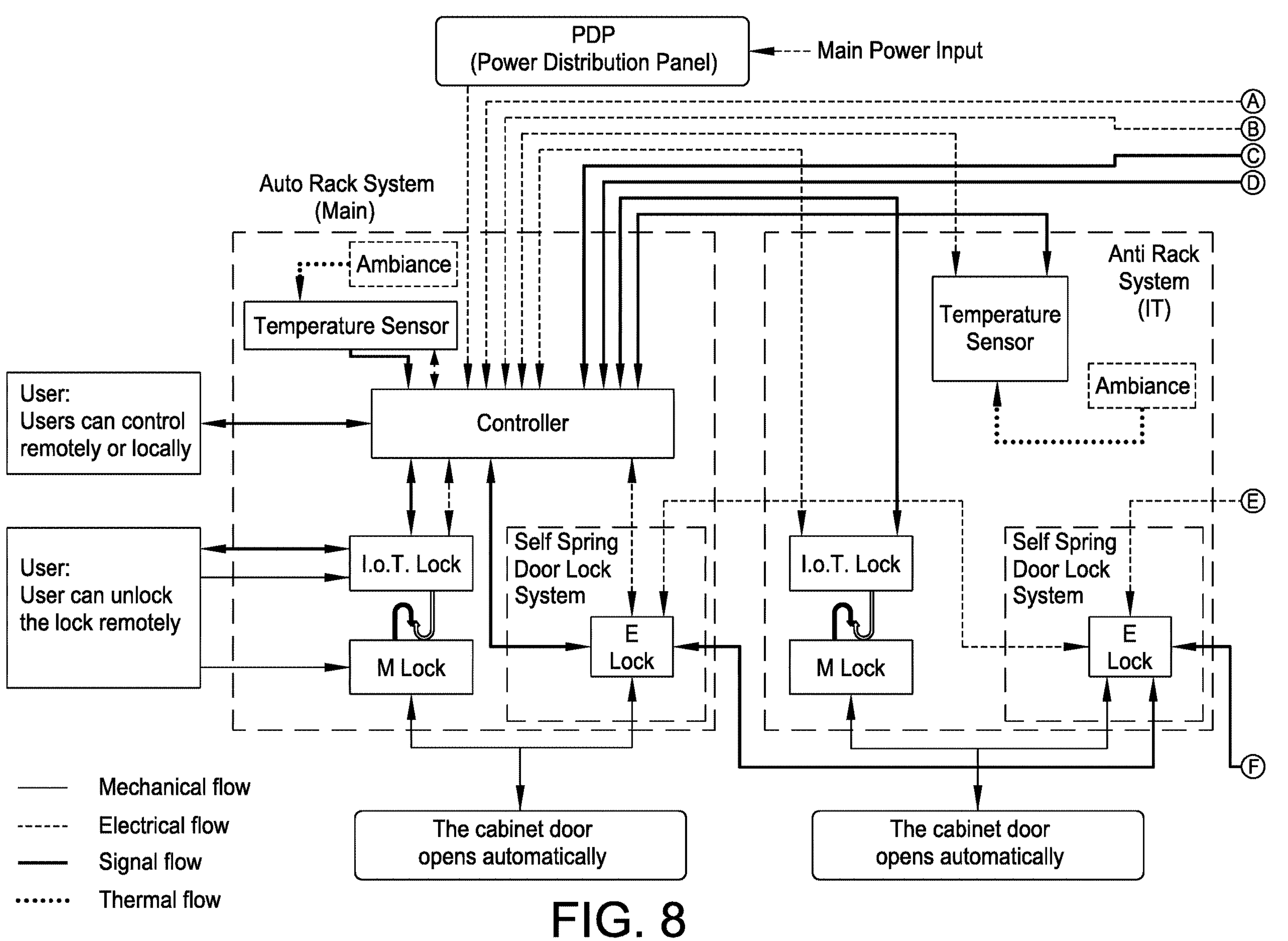
FIG. 8 is a schematic diagram of the automatic unlocking system for multiple IT equipment racks.
Figure 8:
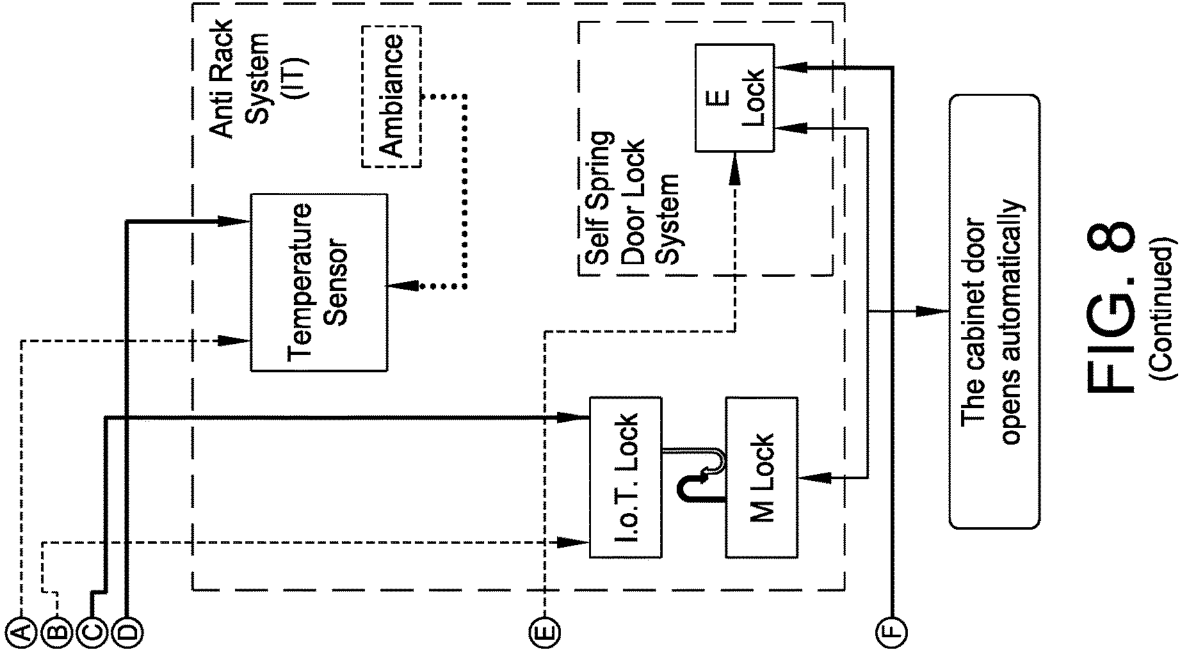

Referring to FIG. 8, the automatic unlocking system can be configured to control the operation of multiple IT equipment racks. As shown, the automatic unlocking system is configured to control a single controller provided in a first IT equipment rack, which in turn, controls the operation of multiple subsequent IT equipment racks. In one embodiment, the controller can be positioned within the first IT equipment rack or positioned somewhere within the data center. The operation of each IT equipment rack is the same as the IT equipment rack described with reference to FIG. 7.

Figures 9, 10, 11, 12, 13:
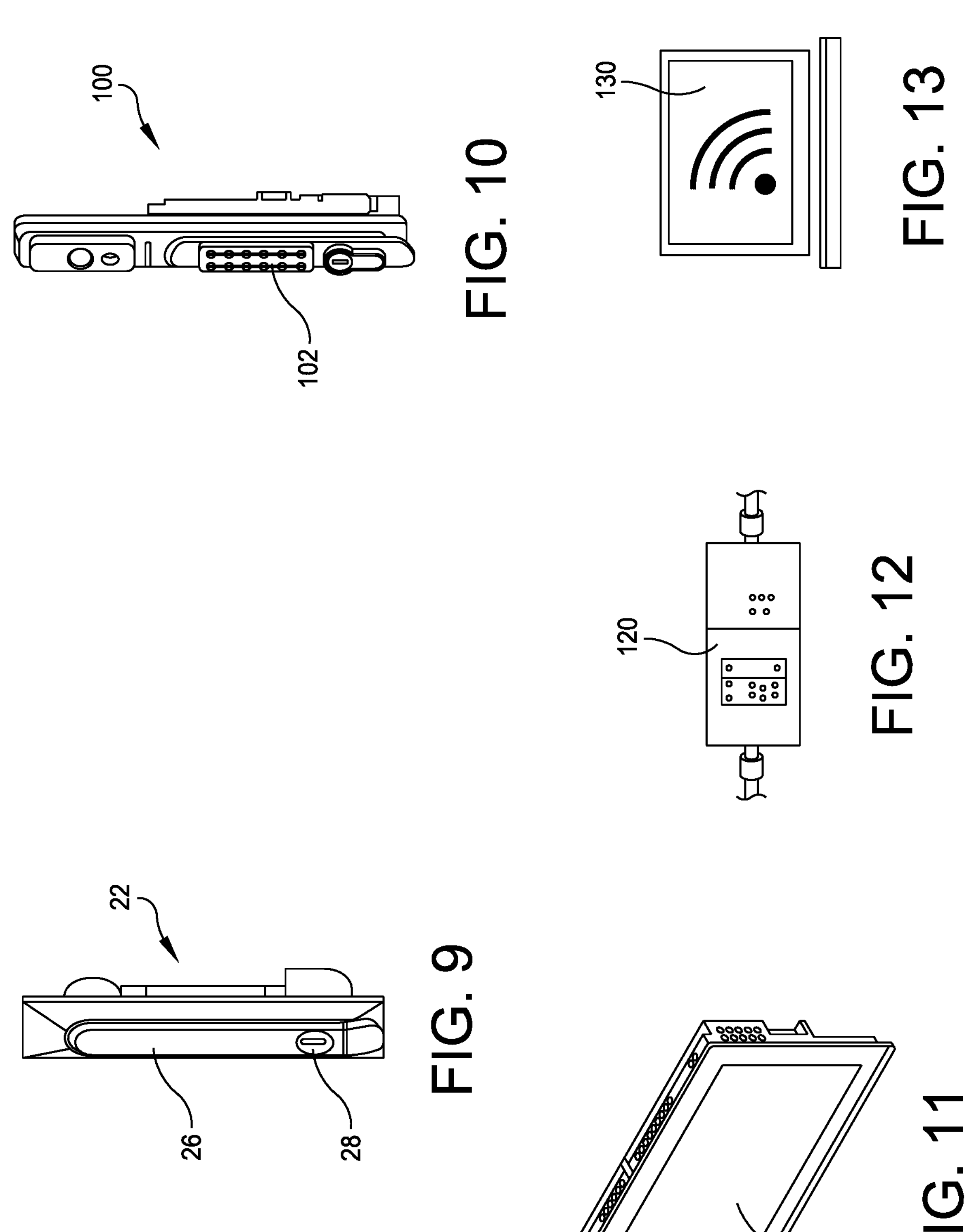
FIG. 9 is a front perspective view of a handle assembly of the automatic unlocking system.
FIG. 10 is a front perspective view of another handle assembly of the automatic unlocking system.
FIG. 11 is a perspective view of a control panel of the automatic unlocking system.
FIG. 12 is a view of a temperature sensor of the automatic unlocking system.
FIG. 13 is a view of a remote control of the automatic unlocking system.

Referring to FIG. 9, in one embodiment, the handle assembly 22 includes the handle 26 and the cylindrical lock 28.

Referring to FIG. 10, in another embodiment, a handle assembly, generally indicated at 100, includes a IoT interface 102, which can include a keypad, a card reader, a fingerprint reader, or some other type of interface. The handle assembly 100 can be configured to rotate the cam 40 to mechanically unlock the door.

Referring to FIG. 11, the automatic unlocking system 20 further can include a control panel 110 to control the operation of the automatic unlocking system. As described above, an administrator using the control panel 110 can send an unlocking signal to the controller of the automatic unlocking system.

Referring to FIG. 12, the automatic unlocking system further can include a temperature sensor 120 to sense a temperature of the IT equipment rack to trigger a locking or unlocking sequence. In one embodiment, it may be desirable to lock the IT equipment rack so as to enable a fire suppression system associated with the IT equipment rack to address the heat build-up in the IT equipment rack. In another embodiment, it may be desirable to unlock the IT equipment rack so as to enable an operator to address the heat build-up in the IT equipment rack.

Referring to FIG. 13, the automatic unlocking system 20 can be operated by a remote control associated with the automatic unlocking system. In one embodiment, a control, e.g., computer system 130, which is provided remotely from the IT equipment rack or rows of IT equipment racks, can control the operation of the automatic unlocking system 20.

Various controllers, such as controller 70, may execute various operations discussed above. Using data stored in associated memory and/or storage, the controller also executes one or more instructions stored on one or more non-transitory computer-readable media, which the controller may include and/or be coupled to, that may result in manipulated data. In some examples, the controller may include one or more processors or other types of controllers. In one example, the controller is or includes at least one processor. In another example, the controller performs at least a portion of the operations discussed above using an application-specific integrated circuit tailored to perform particular operations in addition to, or in lieu of, a general-purpose processor. As illustrated by these examples, examples in accordance with the present disclosure may perform the operations described herein using many specific combinations of hardware and software and the disclosure is not limited to any particular combination of hardware and software components. Examples of the disclosure may include a computer-program product configured to execute methods, processes, and/or operations discussed above. The computer-program product may be, or include, one or more controllers and/or processors configured to execute instructions to perform methods, processes, and/or operations discussed above.

Having thus described several aspects of at least one embodiment, it is to be appreciated various alterations, modifications, and improvements will readily occur to those skilled in the art. Such alterations, modifications, and improvements are intended to be part of this disclosure and are intended to be within the scope of the disclosure. Accordingly, the foregoing description and drawings are by way of example only.

What is claimed is:

1. An automatic unlocking system for an IT equipment rack, the system comprising:
- a handle assembly configured to be mounted on a door of the IT equipment rack, the handle assembly including a handle and a cam coupled to the handle; and
- an unlock assembly configured to be mounted on a wall of the IT equipment rack, the unlock assembly including an unlock mechanism having at least one rod and a spring pin subassembly coupled to the cam and the at least one rod, the spring pin subassembly including a first spring pin configured to engage the cam and a second spring pin configured to engage the at least one rod, the unlock mechanism being configured to
  - open the door when the cam rotates causing movement of the at least one rod, and
  - open the door when the unlock assembly receives an electrical unlock signal.

2. The system of claim 1, further comprising a controller coupled to the unlock mechanism of the unlock assembly to control operation of the unlock mechanism.

3. The system of claim 2, further comprising a sensor positioned within the IT equipment rack and coupled to the controller.

4. The system of claim 3, wherein the sensor is configured to detect a parameter within the IT equipment rack, the controller being configured to send the electrical unlock signal when the parameter exceeds a predetermined threshold.

5. The system of claim 1, wherein the handle assembly further includes a base secured to the door and configured to support the handle.

6. The system of claim 5, wherein the handle assembly further includes a lock supported by the base and configured to secure and release the handle.

7. The system of claim 1, wherein the handle is configured to rotate the cam to open the door.

8. The system of claim 1, further comprising a housing configured to support the unlock mechanism.

9. The system of claim 1, wherein the unlock assembly further includes a latch configured to releasably engage and secure a hook associated with the door to secure the door in a closed position.

10. The system of claim 1, wherein the at least one rod is configured to move a latch of the unlock assembly from a first position in which the latch engages and secures a hook of the door to maintain the door in a locked condition to a second position in which the latch disengages the hook of the door when the cam rotates to cause the movement of the at least one rod to unlock the door, and
- wherein the electrical unlock signal is configured to move the latch from the first position to the second position to open the door when the unlock assembly receives an electrical unlock signal.

11. The system of claim 1, wherein the spring pin subassembly is configured to translate rotation of the cam to engage the at least one rod.

12. The system of claim 1, wherein the second spring pin is perpendicular to the first spring pin, the first spring pin and the second spring pin each having mating chamfered surfaces.

13. The system of claim 1, wherein the unlock assembly further includes an actuator including a plunger configured to engage and move the door when the cam moves the at least one rod and engage and move the door when the unlock assembly receives an electrical unlock signal.

14. The system of claim 13, wherein the actuator further includes a spring to move the plunger outward toward the door.

15. A door opening system comprising:
- a handle;
- a cam coupled to the handle and configured to move at least one rod when rotated by the handle; and
- an unlock assembly including the at least one rod and a spring pin subassembly coupled to the cam and the at least one rod, the spring pin subassembly including a first spring pin configured to engage the cam and a second spring pin configured to engage the at least one rod, the unlock assembly being configured to
  - open a door when the cam moves the at least one rod, and
  - open the door when the unlock assembly receives an electrical unlock signal.

16. The system of claim 15, further comprising a controller coupled to the unlock assembly to control operation of the unlock assembly.

17. The system of claim 16, further comprising a sensor positioned within an IT equipment rack and coupled to the controller.

18. The system of claim 17, wherein the sensor is configured to detect a parameter within the IT equipment rack.

19. The system of claim 15, wherein the handle includes a base secured to the door and configured to support the handle.

20. The system of claim 19, wherein the base of the handle is configured to support a lock, the lock being configured to secure and release the handle.

21. The system of claim 15, wherein the handle is configured to rotate the cam to open the door.

22. The system of claim 15, wherein the at least one rod is configured to unlock a latch, which is configured to releasably engage and secure a hook associated with the door to secure the door in a closed position.

23. The system of claim 15, wherein the electrical unlock signal is configured to unlock a latch, which is configured to releasably engage and secure a hook associated with the door in a closed position.

24. The system of claim 15, wherein the unlock assembly further includes an actuator including plunger configured to engage and move the door when the cam moves the at least one rod and engage and move the door when the unlock assembly receives an electrical unlock signal.

25. The system of claim 24, wherein the actuator further includes a spring to move the plunger outward toward the door.

26. A method of opening a door of an IT equipment rack by one of two modes, the method comprising:
- opening the door by a first mode including rotating a handle and a cam coupled to the handle, the cam being configured to move at least one rod of an unlock mechanism when rotated to unlock a latch of the unlock mechanism, the unlock mechanism including a spring pin subassembly coupled to the cam and the at least one rod, the spring pin subassembly including a first spring pin configured to engage the cam and a second spring pin configured to engage the at least one rod; or opening the door by a second mode including sending an electrical unlock signal to the unlock mechanism to unlock a latch of the unlock mechanism.

27. The method of claim 26, further comprising sensing a parameter within the IT rack, and opening the door by the second mode when the parameter exceeds a predetermined threshold.

28. The method of claim 26, wherein the latch is configured to releasably engage and secure a hook associated with the door to secure the door in a closed position.

29. The method of claim 26, wherein the cam is configured to move the at least one rod by engaging the first spring pin.

30. The method of claim 29, wherein the first spring pin is configured to engage the second spring pin, which is configured to engage the at least one rod.

31. The method of claim 30, wherein the second spring pin is perpendicular to the first spring pin, the first spring pin and the second spring pin each having mating chamfered surfaces.

32. An automatic unlocking system to open a door of an IT equipment rack, the system comprising:

means for opening the door by a first mode including rotating a handle to unlock a latch and a cam coupled to the handle, the cam being configured to move at least one rod when rotated to unlock the latch, and including a spring pin subassembly coupled to the cam and the at least one rod, the spring pin subassembly including a first spring pin configured to engage the cam and a second spring pin configured to engage the at least one rod;

and means for opening the door by a second mode including sending an electrical unlock signal to unlock the latch.

* * * * *